(12) United States Patent
Hwang et al.

(10) Patent No.: US 11,486,897 B2
(45) Date of Patent: Nov. 1, 2022

(54) CONTACT AND TEST SOCKET DEVICE FOR TESTING SEMICONDUCTOR DEVICE

(71) Applicants: Dong Weon Hwang, Gyeonggi-do (KR); Jae Suk Hwang, Berkeley, CA (US); Jae Baek Hwang, Seoul (KR)

(72) Inventors: Dong Weon Hwang, Gyeonggi-do (KR); Jae Suk Hwang, Berkeley, CA (US); Jae Baek Hwang, Seoul (KR)

(*) Notice: Subject to any disclaimer, the term of this patent is extended or adjusted under 35 U.S.C. 154(b) by 0 days.

(21) Appl. No.: 17/158,441

(22) Filed: Jan. 26, 2021

(65) Prior Publication Data

US 2021/0148950 A1 May 20, 2021

Related U.S. Application Data

(62) Division of application No. 15/833,419, filed on Dec. 6, 2017, now Pat. No. 10,935,572.

(30) Foreign Application Priority Data

May 30, 2017 (KR) .................. 10-2017-0066960

(51) Int. Cl.
*G01R 1/067* (2006.01)
*G01R 31/28* (2006.01)
*G01R 1/04* (2006.01)

(52) U.S. Cl.
CPC ....... *G01R 1/06722* (2013.01); *G01R 1/0466* (2013.01); *G01R 1/0483* (2013.01); *G01R 1/06716* (2013.01); *G01R 1/06727* (2013.01); *G01R 31/2886* (2013.01)

(58) Field of Classification Search
CPC .............. G01R 1/06722; G01R 1/0466; G01R 1/06727; G01R 31/2886
See application file for complete search history.

(56) References Cited

U.S. PATENT DOCUMENTS

| 9,435,827 B2 | 9/2016 | Pak | |
| 2005/0250354 A1* | 11/2005 | Vinther | G01R 1/06733 439/66 |

FOREIGN PATENT DOCUMENTS

| JP | 2003303657 A | | 10/2003 |
| JP | 2011012992 A | | 1/2011 |
| JP | 2012107970 A | * | 6/2012 |
| JP | 2013167616 A | | 8/2013 |
| JP | 2016223996 A | * | 12/2016 |
| KR | 1020060062824 A | | 6/2006 |

OTHER PUBLICATIONS

English translation of JP 2016-223996A (Year: 2016).*

* cited by examiner

*Primary Examiner* — Paresh Patel
(74) *Attorney, Agent, or Firm* — Levenfeld Pearlstein, LLC

(57) ABSTRACT

The present invention relates to a contact and a socket device for testing a semiconductor device. The contact of the present invention is a spring contact which is integrally formed by blanking and bending a metal plate member and includes an elastic portion made of various strips of certain pattern and a tip provided at both ends of the elastic portion. Preferably, an inner volume of the contact is filled with a filler having conductivity and elasticity, whereby durability and electrical characteristics are excellent. Further, the test socket according to the present invention is a rubber type employing the above-mentioned contact and has an advantage that it is suitable for testing a fine pitch device.

10 Claims, 34 Drawing Sheets

CONTACT AND TEST SOCKET DEVICE FOR TESTING SEMICONDUCTOR DEVICE

CROSS REFERENCE TO RELATED APPLICATION

The present application is a divisional of U.S. patent application Ser. No. 15/833,419, filed Dec. 6, 2017, titled, CONTACT AND TEST SOCKET DEVICE FOR TESTING SEMICONDUCTOR DEVICE, which claims priority to Korean Patent Application No. 10-2017-0066960, filed May 30, 2017, the entire contents of which are incorporated herein for all purposes by this reference.

BACKGROUND OF THE INVENTION

Field of the Invention

The present invention relates generally to a contact and a socket device for testing a semiconductor device. More particularly, the present invention relates to a contact and a socket device which are buried in a test socket for testing an IC, whereby the contact and the socket device provides electrical connection between the contact points and leads, such as electrical connection between leads of an IC and pads of a PCB, or electrical connection between a PCB and leads of an IC such as a CPU inside electronic products such as a personal computer (PC), a mobile phone, and so on.

Description of the Related Art

The test socket is a component for inspecting defects of a semiconductor device at a semiconductor post-processing step. The test socket is a part for contacting the device at the first end and transmitting a signal transmitted through a test device and a test board to the device during a test process.

The test socket requires mechanical contact characteristics allowing individual devices to move to the correct positions and be in contact with the test board precisely, and stable electrical contact characteristics allowing the signal to be transmitted without signal distortion at the contact point during signal transmission.

Since the test socket is a consumable component of which mechanical and electric characteristics are degraded by a repeated test process, it is necessary to reduce the costs of the test process by extending the lifetime and increasing the number of times of use.

There are two main reasons for the lifetime of the test socket being reduced: first, there is a problem that the socket is mechanically broken due to an unstable contact; and second, there is a problem that contamination of a contact portion raises the contact resistance due to continuous contact whereby electrical characteristics become unstable.

The test socket commonly used may be classified into a pin type and a rubber type depending on a type of conductive means connecting the semiconductor device and test device.

FIGS. 1A and 1B are cross-sectional views of the pin-type test socket and the-rubber type test socket, respectively.

Referring to FIG. 1A, the pin-type test socket 10 includes a socket body 11 having a plurality of contact pins 12 that is bent and has elasticity, a cover 13 moved vertically at an upper portion of the socket body 11, and a latch 14 assembled rotationally with respect to the socket body 11 to hold or release a device 20 in engagement with vertical movement of the cover 13.

The contact pin 12 is vertically elastic and functions to provide electrical connection between leads of the device and pads of the test device. There are various contact pins in accordance with materials and shapes of leads of the device and the pads of the test device, for example, a pogo-pin configured with a plunger, a barrel, and a spring.

The latch 14 is formed with a guide slot 14a, in which a guide pin 15a is clamped, and the guide pin 15a has one end held at a moving link 15 hinge-fastened to the cover 13. The cover 13 is flexibly supported by a coil spring 16.

According to the pin-type test socket 10, when pressing the cover 13, it is possible to load the device 20 as the latch 14 directs outward, and when releasing the cover 13, the latch 13 may press the top of the device 20 by an elastic restoring force of the coil spring 15, thereby holding the device 20.

However, because the contact pin 12 has a spiral structure or a curved structure to have elasticity, the pin-type test socket has a long current path which leads to a problem of signal loss. Thus, the test socket is unfavorable structure in an ultrahigh frequency band. Further, in a fine pitch test socket, there are problems that procedures of producing the housing structure in which the contact pin 12 is buried are complex and production costs are remarkably increased.

Subsequently, referring to FIG. 1B, the rubber-type test socket 30 includes a connector body 31 having an elastic insulating silicon powder solidified, and a conductive silicon portion 32 vertically formed through the connector body 31 to correspond to a solder ball (lead) 21 of the device 20. The conductive silicon portion 32 vertically passes through the connector body 31 and has an approximately cylindrical shape.

A method of producing the rubber-type test socket will be explained now. When putting a molten silicon mixture of an insulating powder and a conductive powder at a predefined ratio into a mold, melting the mixture, and applying an electric current to a position in which the conductive silicon portion is formed, the conductive powder of the silicon mixture concentrates in the position to which the electric current is applied, and then the molten silicon mixture is solidified to obtain the test socket 30 in which the conductive silicon portion 32 is formed.

Such test socket 30 has a test device located in a lower portion, so that a bottom of the conductive silicon portion 32 contacts the pad and a top of the conductive silicon portion 32 is in electrical contact with the solder ball 21 as the device 20 is pressed at a predetermined pressure.

Since the rubber-type test socket 30 is made of a soft material and has elasticity, a top surface of the conductive silicon portion 32 surrounds the solder ball 21 to make stable electric contact. At this time, a central portion of the conductive silicon portion 32 expands outwards.

However, such rubber-type test socket 30 has a disadvantage that the elasticity is lost during the repeated test processes and the service life is remarkably decreased. Therefore the number of times of use is short and cost increases due to frequent replacement.

Particularly, in the rubber-type test socket, it is not easy to secure a sufficient insulation distance L between adjacent conductive silicon portions 32 in the device of fine pitch, resulting in the likelihood that a circuit short occurs.

More specifically, in a case of the test socket for use with fine pitch device, it is very important to secure the sufficient insulating distance L between the conductive silicon portions 32 when the distance between the conductive silicon portions 32 is very short.

As explained earlier, however, in the rubber-type test socket 30, the voltage is applied to the silicon molten mixture of the insulating powder and the conductive powder so that the conductive powder concentrates along a current path to allow the conductive silicon portion 32 to be formed. Therefore, the conductive powder concentrated along the current path is not distributed within a precisely defined diameter d, resulting in a density D of the conductive powder having a continuously damping section δ.

Therefore, there is a problem that the rubber-type test socket 30 has a certain damping section δ away from the defined diameter d which causes the insulting distance L between the adjacent conductive silicon portions 32 to be considerably short, which is not preferable for the test socket for use in a fine pitch device.

In addition, another problem of the rubber-type test socket resides is that a voltage is applied for considerable time in order to obtain a sufficient density of the conductive powder along a current path when applying the voltage to the silicon mixture during a manufacturing process, thus it takes a long time to manufacture the test socket.

The present inventor has developed a new type of hybrid contact and test socket device that may overcome the disadvantages of pin-type test socket and rubber-type test socket according to the related art and combine the advantages thereof.

DOCUMENTS OF RELATED ART (Patent Publication Document) KR 10-2006-0062824 A (publication date: Jun. 12, 2006)

SUMMARY OF THE INVENTION

Accordingly, the present invention has been made keeping in mind the above problems occurring in the related art, and the present invention is intended to propose a test socket device suitable for a fine pitch device that may have a superior electric characteristic and extend a lifetime test socket device by overcoming the disadvantages of the pin-type test socket and the rubber-type test socket according to the related art.

Further, the present invention is intended to provide a contact having a structure suitable for the test socket device for used in a fine pitch device.

A contact according to one aspect of the present invention is related to a contact integrally formed by blanking a metal plate member and rolling the metal plate member into a cylindrical shape, and includes: an upper head portion formed in a cylindrical shape and having an upper indented portion protruding upwards; an elastic portion obliquely extending into a lateral and downward direction from the upper head portion and formed of a strip spirally bent into a cylindrical shape to be coaxial with the upper head portion; and a lower head portion having a lower indented portion protruding downwards and extending vertically from a lower end of the elastic portion to be coaxial with the elastic portion.

A contact according to other aspect of the present invention is related to a contact integrally formed by blanking a metal plate member and rolling the metal plate member into a cylindrical shape, and includes: a first elastic portion formed by connecting a plurality of closed-loop strips of an identical size in series by using a first portion, and by bending the closed-loop strips into a cylindrical shape; a second elastic portion formed by connecting a plurality of closed-loop strips of the size identical to the size of the closed-loop strips of the first elastic portion in series by using a second portion, and by bending closed-loop strips into a cylindrical shape; a bent portion having a width and a length larger than widths and lengths of the first portion and the second portion and connecting the closed-loop strips in a lowermost end and an uppermost end of the first elastic portion and the second elastic portion in series; an upper head portion having an upper indented portion protruding upwards and extending from the uppermost end of the first elastic portion, and being bent into a cylindrical shape; and a lower head portion having a lower indented portion protruding downwards and extending from the lowermost end of the second elastic portion, and being bent into a cylindrical shape.

A contact according to another aspect of the present invention is related to a contact integrally formed by blanking a metal plate member and rolling the metal plate member into a cylindrical shape, and includes: a first elastic portion formed by connecting unit strips of a horizontal strip and a vertical strip that vertically extends from one end of the horizontal strip and has a length shorter than a length of the horizontal strip in a zigzag shape, and by bending the unit strips into a cylindrical shape; a second elastic portion formed by connecting unit strips having a structure and a size identical to a structure and a size of the first elastic portion in a zigzag shape, and by bending the unit strips into a cylindrical shape; a bent portion having a width and a length larger than widths and lengths of the vertical strips in the first elastic portion and the second elastic portion, and vertically connecting the horizontal strips at a lowermost end and an uppermost end of each of the first elastic portion and the second elastic portion to each other at centers of the horizontal strips; an upper head portion having an upper indented portion protruding upwards and extending from the uppermost end of the first elastic portion, and being bent into a cylindrical shape; and a lower head portion having a lower indented portion protruding downwards and extending from the lowermost end of the second elastic portion, and being bent into a cylindrical shape.

Preferably, the contact further includes a filler having conductivity and elasticity that fills at least a coil section between the upper head portion and the lower head portion in a cylindrical shape.

Further, the test socket according to the present invention is related to a test socket including the above-described contact and includes a mounting portion having a plurality of through-holes corresponding to leads of a device for allowing the contact to be received and positioned therein; and an elastic insulating body portion integrally holding the contact and the mounting portion.

The contact of the present invention is a spring contact integrally formed by blanking a metal plate member and rolling the metal plate member into a cylindrical shape, wherein the spring contact includes: an elastic portion composed of a single strip or closed-loop strips of a certain pattern; and a tip provided respectively at both ends of the elastic portion, the cylindrical inner volume thereof being filled with a filler having conductivity and elasticity. Therefore, there are advantages in that the disadvantages of each of the pin socket type and the rubber type test socket apparatus of the related art may be overcome, excellent electrical characteristics may be obtained, and service life may be extended, Further, another advantage of the rubber-type test socket according to the present invention embodied by the contact describe above resides in that the test socket addresses the problems of the rubber-type test socket device according to the related art, and particularly is preferable for testing a fine pitch device.

BRIEF DESCRIPTION OF THE DRAWINGS

The above and other objects, features, and other advantages of the present invention will be more clearly understood from the following detailed description when taken in conjunction with the accompanying drawings, in which.

DETAILED DESCRIPTION OF THE INVENTION

Figure 1A:
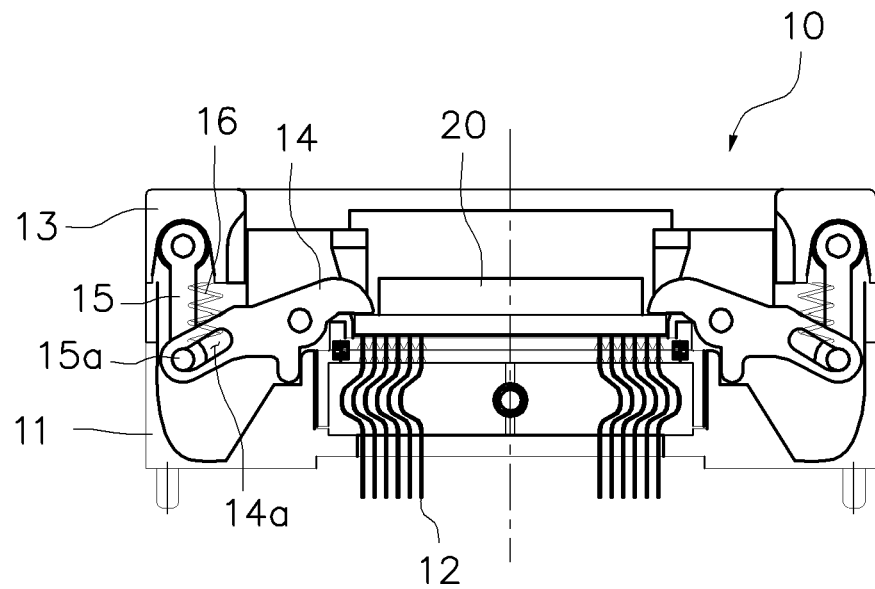
FIGS. 1A and 1B are cross-sectional views of general pin-type and rubber-type test sockets, respectively.
Figure 1B:
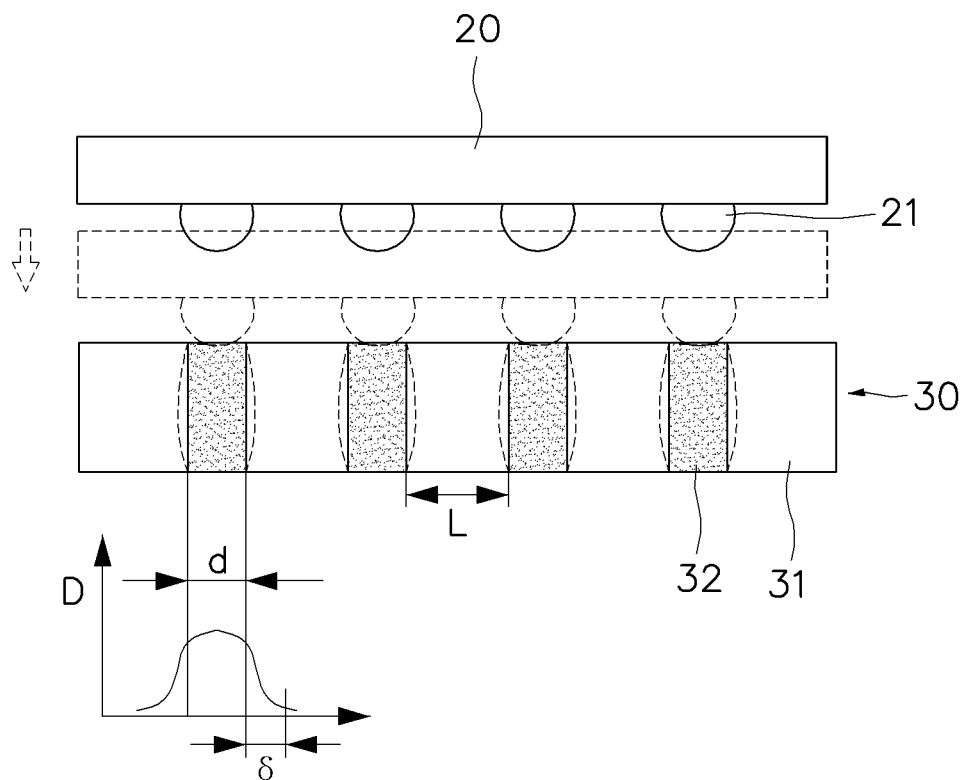

First, terms and words used in the present specification and claims should not be construed as limited to ordinary or dictionary terms, but should be construed in meaning and concept consistent with the technical idea of the present invention based on a principle that the inventor can properly define the concept of the term to describe his/her invention in the best way.

Therefore, the embodiments described in the present specification and the configurations shown in the drawings are only the most preferred embodiments of the present invention, and not all of the technical ideas of the present invention are described. Therefore, it should be understood that various equivalents and modifications may be present.

The present invention is characterized in a contact of hybrid type including a contact integrally formed by rolling a strip obtained by blanking a metal sheet member into a cylindrical shape, and a conductive and elastic portion filled within the cylindrical structure of the contact.

Hereinafter, preferable embodiments of the present invention will be specifically described referring to accompanying drawings.

First Embodiment

Figure 2A:
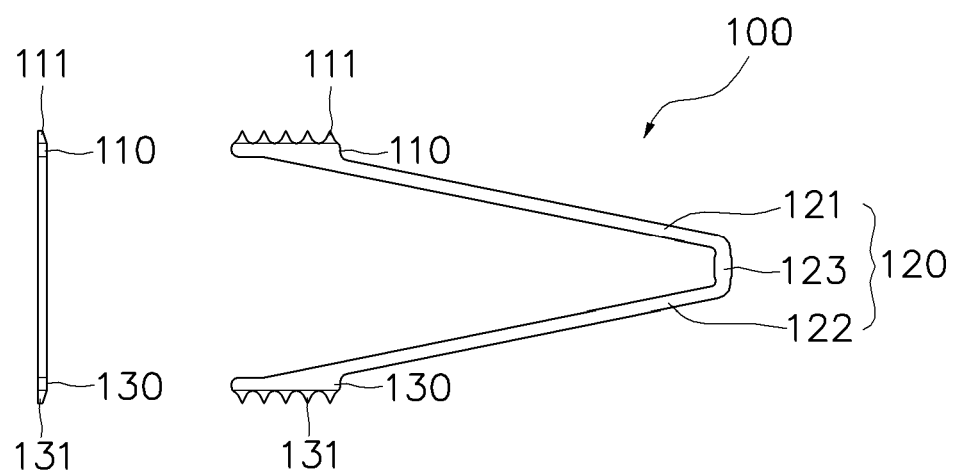
FIGS. 2A, 2B, 3A, and 3B are views showing a contact according to a first embodiment of the present invention.
Figure 2B:
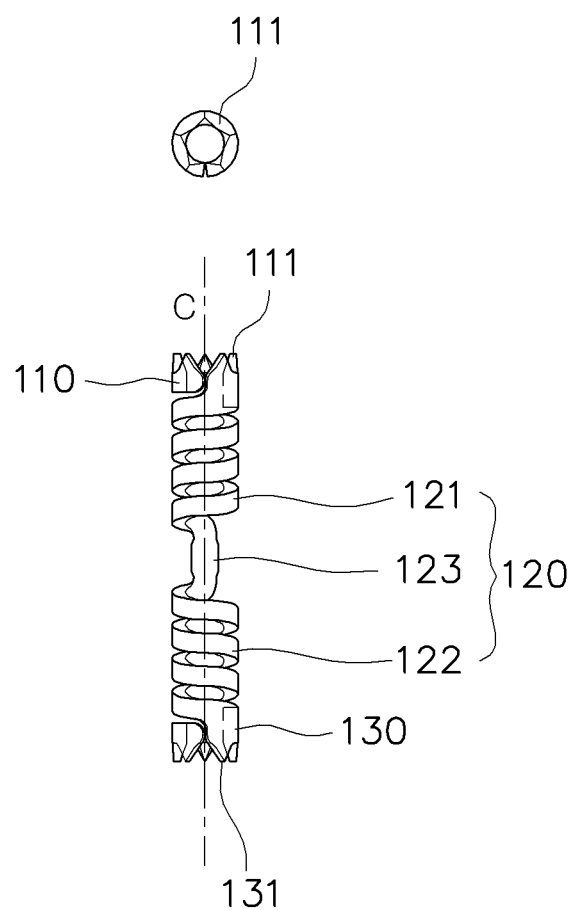
Figure 3A:
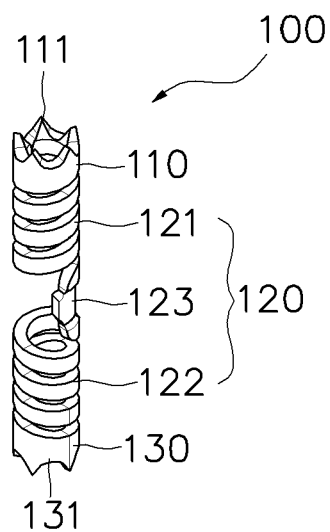
Figure 3B:
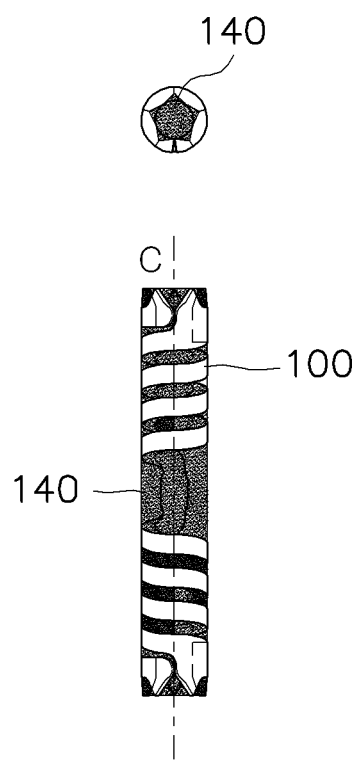

FIGS. 2A, 2B, 3A and 3B are views showing a contact according to a first embodiment of the present invention, in which FIG. 2A is a left side view and a plan view in which plate-shaped pattern is spread, from left; FIG. 2B is a plan view and a front view of a contact processed through a rolling-process, from top; FIG. 3A is a perspective view of a contact processed through a rolling-process; and FIG. 3B is a plan view and a front view of a contact of hybrid type that is filled with a filler, from top.

Referring to FIGS. 2A, 2B, and 3A, a contact 100 of a plate-shaped pattern according to the present embodiment includes an upper head portion 110 having an upper indented portion 111 protruding upwards, an elastic portion 120 of a strip obliquely extending from the upper head portion 110 into a lateral and downward direction, and a lower head portion 130 having a lower indented portion 131 protruding downwards and formed to extend from a lower end of the elastic portion 120.

The contact may be manufactured by blanking a plate member of beryllium copper (BeCu), copper alloy, or stainless steel (SUS) or the like in a certain pattern, and then bending the plate-shaped pattern into a cylindrical shape. Herein, Au, palladium (Pd), palladium nickel (PdNi) or palladium cobalt (PdCo) may be plated on a surface of the contact.

The upper head portion 110 is constructed by rolling the plate-shaped pattern into a cylindrical shape, and the upper indented portion 111 may have a plurality of teeth protruding upwards along an edge of the upper head portion 110.

The elastic portion 120 may be a strip of a specific width and is spirally bent into a cylindrical shape to be coaxial with the upper head portion 110. In this embodiment, the elastic portion 120 has a bent portion 123 in an extending section thereof. At this time, the bent portion 123 means a section in which the strips having directions opposite to each other are connected. At this time, the bent portion 123 is provided to allow a width in a partial section of the strip to be wider or narrower, whereby the bent portion serves as an operation point of a central point when rolling the strip into a cylindrical shape.

In this embodiment, the elastic portion 120 includes a first elastic portion 121 extending from the upper head portion 110 based on the bent portion 123, and a second elastic portion 122 extending from the lower head portion 130 based on the bent portion 123. The first elastic portion 121 and the second elastic portion 122 are vertically symmetrical with respect to the bent portion 123 and extend in the directions opposite to each other, whereby winding directions of the first elastic portion 121 and the second elastic portion 122 are opposite to each other.

The lower head portion 130 is coaxial with the upper head portion 110. In other words, the lower head portion 130 has an axis C identical to that of the upper head portion 110 so that the upper head portion 110, the elastic portion 120, and the lower head portion 130 may be located along the single axis C.

Subsequently, as described in FIG. 3B, the contact 100 allows a cylindrical inner part to be filled with a filler 140 having conductivity and elasticity. For reference, the contact filled with the filler refers to a hybrid contact according to the present invention.

The filler 140 in this embodiment may be an insulating member mixed with conductive particles. For example, the mixture of conductive powder and insulating silicon powder is filled within the cylindrical inner part of the contact, melted, and then solidified, thereby obtaining a hybrid contact having conductivity and elasticity.

Meanwhile, it is possible to use a mold when melting and solidifying the mixture. The mold is formed with a receiving hole, into which the contact processed through a rolling process is inserted and positioned. It is possible to obtain the hybrid contact by putting the mixture into the receiving hole into which the contact inserted, solidifying the mixture, and then removing the mixture from the mold.

The conductive particles may be particles of metal material, or particles having gold, silver, palladium, palladium Nickel, or palladium Cobalt (PdCo) and the like on a surface of metal or non-metal particles, or may be mixed with carbon nanotubes, and so on.

An elastic polymer material may be used as a main insulating material constituting the filler 140. Typically, silicon may be used, but the present invention is not limited thereto.

Further, although the filler 140 is filled cylindrically from the upper indented portion 111 to the lower indented portion 131 in this embodiment, the filler 140 may be filled cylindrically as necessary in only a coil section 120 having relatively high electric resistance except for the upper head portion 110 and the lower head portion 130.

Second Embodiment

Figure 4A:
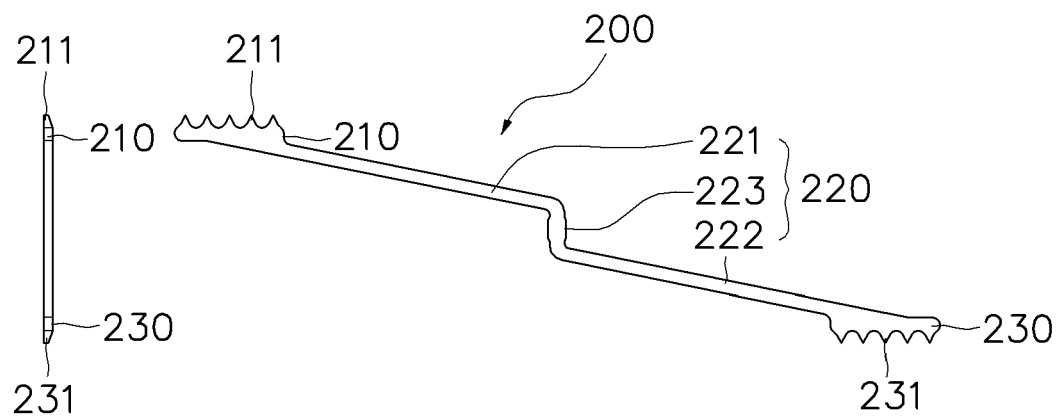
FIGS. 4A, 4B, and 5 are views showing a contact according to a second embodiment of the present invention.
Figure 4B:
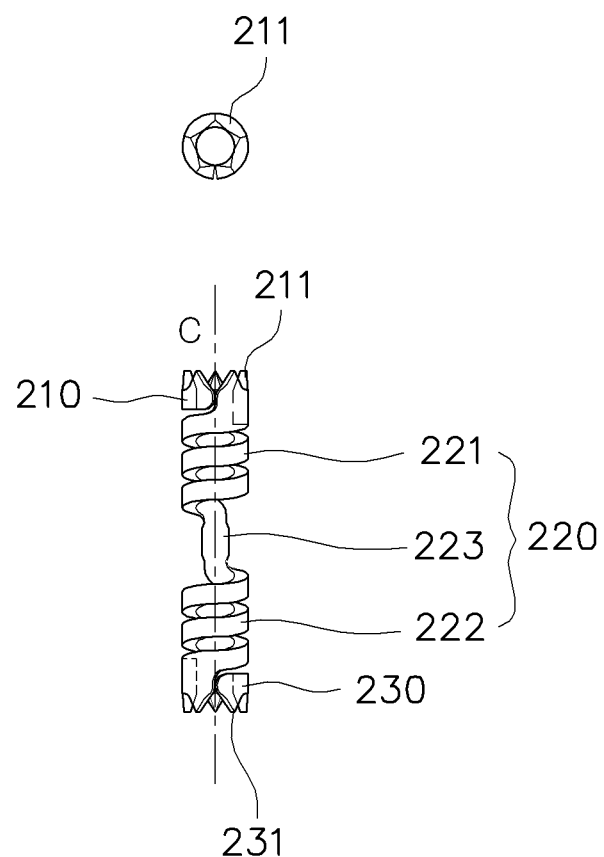
Figure 5:
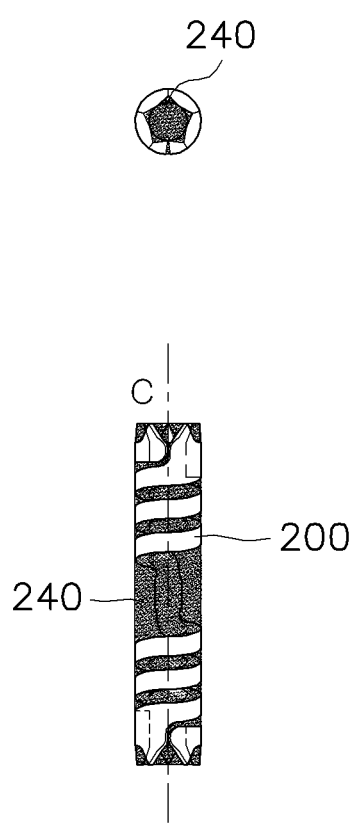

FIGS. 4A, 4B, and 5 are views showing a contact according to a second embodiment of the present invention, in which FIG. 4A is a left side view and a plan view in which plate-shape pattern is spread, from left; FIG. 4B is a plan view and a front view of a contact processed through a rolling-process, from top; and FIG. 5 is a plan view and a front view of a contact of hybrid type that is filled with filler, from top.

Referring to FIGS. 4A and 4B, a contact 200 of a plate-shaped pattern according to the present embodiment includes an upper head portion 210 having an upper indented portion 211 protruding upwards, an elastic portion 220 of a strip obliquely extending from the upper head portion 210 into a lateral and downward direction, and a lower head portion 230 having a lower indented portion 231 protruding downwards and formed to extend from a lower end of the elastic portion 220.

The upper head portion 210 is constructed by rolling the plate-shaped pattern into a cylindrical shape, and the upper indented portion 211 may have a plurality of teeth protruding upwards along an edge of the upper head portion 210.

The elastic portion 220 may be a strip of a specific width, and is spirally bent into a cylindrical shape coaxial with the upper head portion 210. In other words, the elastic portion 220 has an axis C identical to that of the upper head portion 210. In particular, the elastic portion 220 has a junction portion 223 bent in an extending section. The junction portion 223 is provided to allow a width in a partial section of the strip to be wider or narrower, whereby the junction portion 223 serves as an operation point when rolling the strip into the cylindrical shape.

In this embodiment, the elastic portion 220 includes a first elastic portion 221 extending from the upper head portion 210 based on the junction portion 223, and a second elastic portion 222 extending from the lower head portion 230 based on the junction portion 223. The first elastic portion 221 and the second elastic portion 222 extend at the same tilt angle, whereby winding directions of the first elastic portion 221 and the second elastic portion 222 are identical.

The lower head portion 230 is coaxial with the upper head portion 210. In other words, the lower head portion 230 has an axis C identical to that of the upper head portion 210, whereby the upper head portion 210, the elastic portion 220, and the lower head portion 230 may be located along the single axis C.

Subsequently, as exemplified in FIG. 5, the contact 200 may be obtained as a hybrid contact by filling the cylindrical inner volume thereof with a filler 240 having conductivity and elasticity.

Because the filler 240 may be manufactured by filling the inner volume of the contact 200 with the mixture of conductive powder and insulating silicon powder and solidifying the mixture as described above in the first embodiment, and materials of the contact and the filler and filling sections are identical to those of the first embodiment, the detailed description thereon will be omitted.

Third Embodiment

Figure 6A:
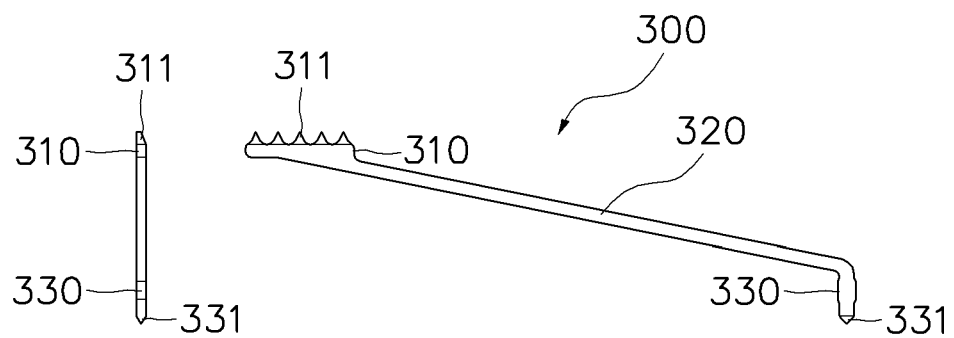
FIGS. 6A, 6B, and 7 are views showing a contact according to a third embodiment of the present invention.
Figure 6B:
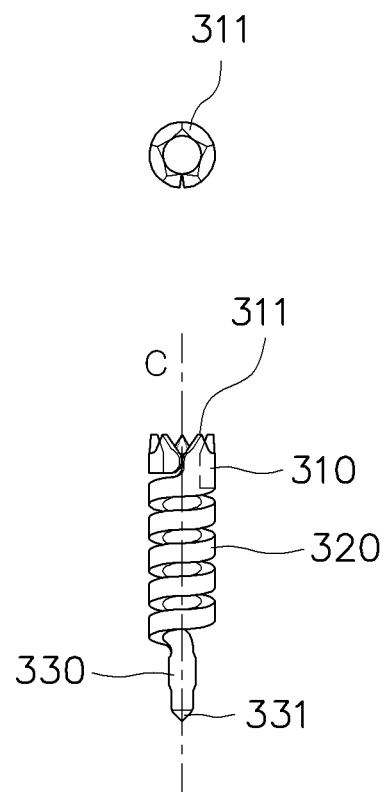
Figure 7:
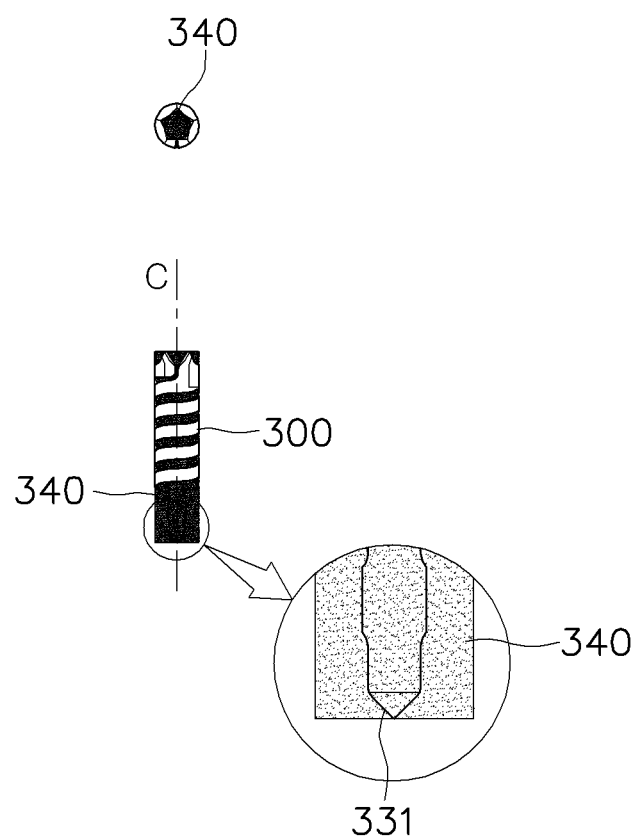

FIGS. 6A, 6B, and 7 are views showing a contact according to a third embodiment of the present invention; FIG. 6A is a left side view and a plan view of a plate-shape pattern, from left; FIG. 6B is a plan view and a front view of a contact processed through a rolling-process, from top; and FIG. 7 is a plan view and a front view of a contact of hybrid type that is filled with a filler, from top.

Referring to FIGS. 6A and 6B, a contact 300 of a plate-shaped pattern according to the present embodiment includes an upper head portion 310 having an upper indented portion 311 protruding upwards, an elastic portion 320 formed of a strip obliquely extending from the upper head portion 310 into a lateral and downward direction, and a lower head portion 330 having a lower indented portion 331 protruding downwards and formed to extend from a lower end of the elastic portion 320.

The upper head portion 310 is constructed by rolling the plate-shaped pattern into a cylindrical shape, and the upper indented portion 311 may have a plurality of teeth protruding upwards along an edge of the upper head portion 310.

The elastic portion 320 may be a strip of a specific width, and is spirally bent into a cylindrical shape coaxial with the upper head portion 310. In other words, the elastic portion 320 has an axis C identical to that of the upper head portion 310, whereby the upper head portion 310 and the elastic portion 320 have the cylindrical shape of the same size.

Meanwhile, although the upper head portion 310 and the elastic portion 320 bent into a cylindrical shape have the cylindrical shape of the same size as exemplified in FIG. 6B, the upper head portion 310 and the elastic portion 320 may have a size different from each other.

The elastic portion 320 extends with a specific width and a tilt angle without a separate portion unlike earlier embodiments, to allow the elastic portion 320 to be spirally bent at one winding direction.

The lower head portion 330 is located along an axis C identical to that of the upper head portion 310, whereby the upper head portion 310, the elastic portion 320 and the lower head portion 330 may be located along the single axis C.

Particularly, the lower head portion 330 may be a plate shape other than a cylindrical shape, unlike earlier embodiments. At this time, a width of the lower head portion 330 is slightly larger than that of the elastic portion 320, whereby the lower head portion 330 may serve as an operation point when rolling the elastic portion of a plate member pattern into a cylindrical shape.

As exemplified in FIG. 7, the contact 300 may be implemented as a contact of hybrid type by filling a cylindrical inner volume thereof with a filler 340 having conductivity and elasticity. Preferably, a lower end of the filler 340 is located up to a height identical to that of the lower indented portion 331 and similarly an upper end of the filler 340 is located up to a height identical to that of the upper indented portion so that an inner volume defined by the contact 300 may be filled with the filler 340.

Fourth Embodiment

Figure 8A:
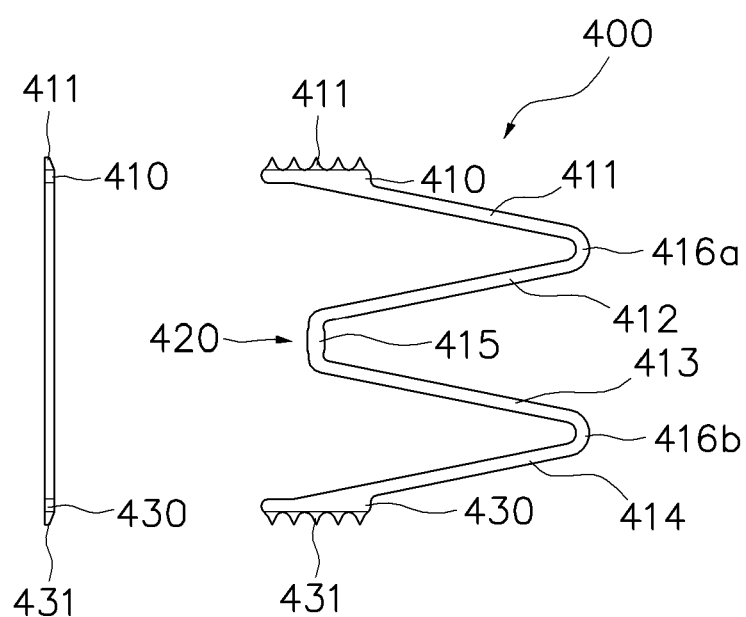
FIGS. 8A, 8B, 9A, and 9B are views showing a contact according to a fourth embodiment of the present invention.
Figure 8B:
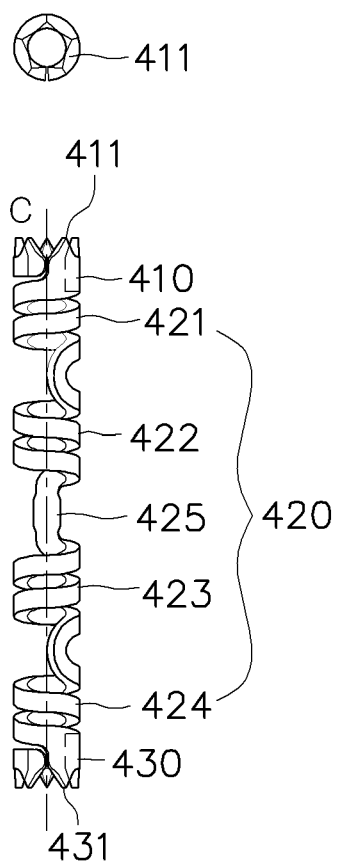
Figure 9A:
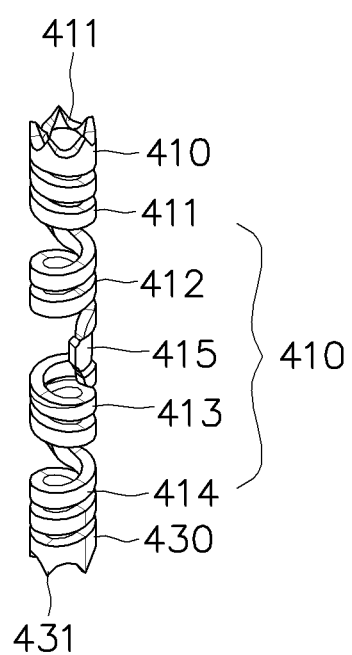
Figure 9B:
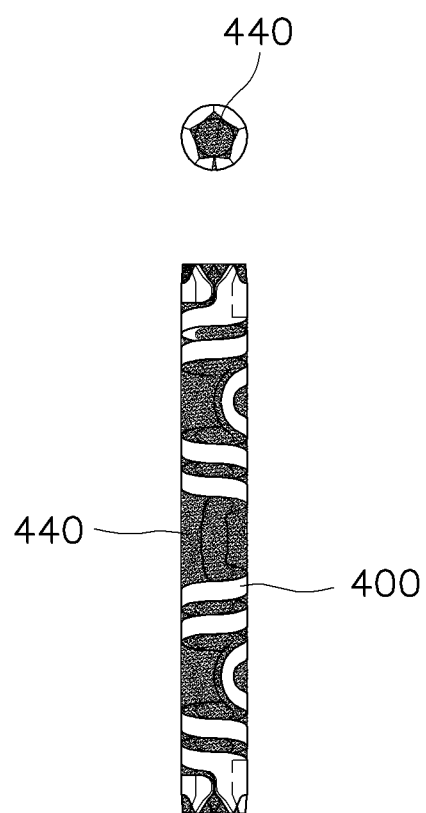

FIGS. 8A, 8B, 9A, and 9B are views showing a contact according to a third embodiment of the present invention; FIG. 8A is a left side view and a plan view of a plate-shape pattern, from left; FIG. 8B is a plan view and a front view of a contact processed through a rolling-process, from top; FIG. 9A is a perspective view of a contact processed through rolling-process; and FIG. 9B is a plan view and a front view of a contact of hybrid type filled with a filler, from top.

Referring to FIGS. 8A, 8B, and 9A, a contact 400 of a plate-shaped pattern according to the present embodiment includes an upper head portion 410 having an upper indented portion 411 protruding upwards, an elastic portion 420 of a strip extending from the upper head portion 410 into a zigzag shape, and a lower head portion 430 having a lower indented portion 431 protruding downwards and formed to extend from a lower end of the elastic portion 420.

The upper head portion 410 is constructed by rolling a plate-shaped pattern into a cylindrical shape, and the upper indented portion 411 may have a plurality of teeth protruding upwards along an edge of the upper head portion 410.

In this embodiment, the elastic portion 420 is a strip extending from the upper head portion 410 in a zigzag shape, and includes a first elastic portion 411 obliquely extending from the upper head portion 410 into a lateral and downward direction, a second elastic portion 412 obliquely extending symmetrically with respect to the front end of the first elastic portion 411, and a third elastic portion 413 and a fourth elastic portion 414 extending from the second elastic portion 412 via a bent portion 415 to be prepared symmetrically with respect to the second elastic portion 412 and the first elastic portion 414, respectively.

Preferably, the first elastic portion 411 and the second elastic portion 412 are connected by a first curved portion 416a, and the third elastic portion 413 and the fourth elastic portion 414 are connected by a second curved portion 416b.

Therefore, in the elastic portion 420 bent into a cylindrical shape, the first elastic portion 411 and the third elastic portion 413 are wound at the same direction, and the second elastic portion 412 and the fourth elastic portion 414 are wound at the same direction. Meanwhile, the winding directions of the first elastic portion 411 and the third elastic portion 413, and the second elastic portion 412 and the fourth elastic portion 414 are opposite to each other.

For reference, the elastic portion of a strip shape may be formed with portions of various types. When the strip is locally bent in accordance of a type of portion, if the strip has an angle gradually varying it may be referred to as a "curved portion", if the strip has an angle abruptly varying it may be referred to as a "bent portion", and if the strip extends at the same angle but has a prescribed step it may be referred to as a "junction portion".

Such portion may have a difference in a width in a longitudinal direction of the strip as described above, and may serve as an operation point to which force is applied when rolling the elastic portion of a plate-shaped pattern into a cylindrical shape. Further, it is possible to change the winding direction of the adjacent elastic portion based on the portion, or change a pitch in a section of coil-shaped elastic portion. Therefore, because the elastic portion according to the present invention may be variably changed by using the portion, it is possible to implement various spring characteristics required by the contact.

The lower head portion 430 is coaxial with the upper head portion 410. In other words, the lower head portion 430 has an axis C identical to that of the upper head portion 410, whereby the upper head portion 410, the elastic portion 420, and the lower head portion 430 may be located along the single axis C.

As exemplified in FIG. 9B, the contact 400 may be implemented as a contact of hybrid type by filling a cylindrical inner volume with a filler 440 having conductivity and elasticity.

Fifth Embodiment

Figure 10A:
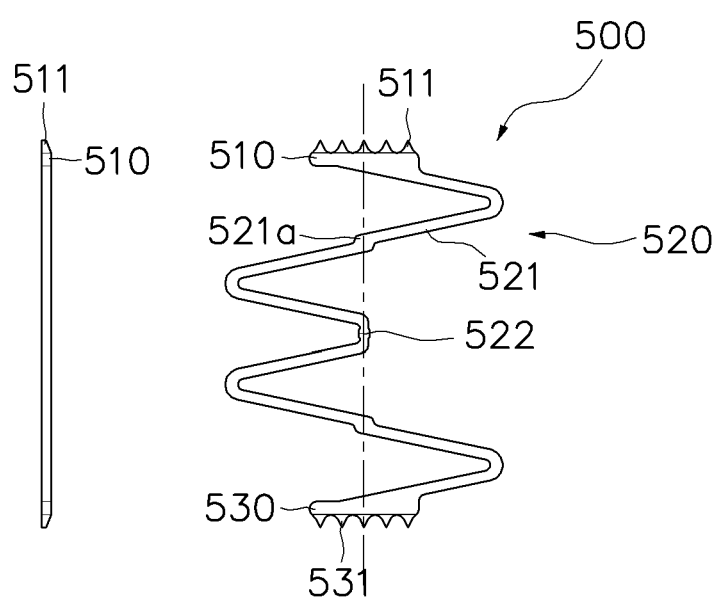
FIGS. 10A, 10B, and 11 are views showing a contact according to a fifth embodiment of the present invention.
Figure 10B:
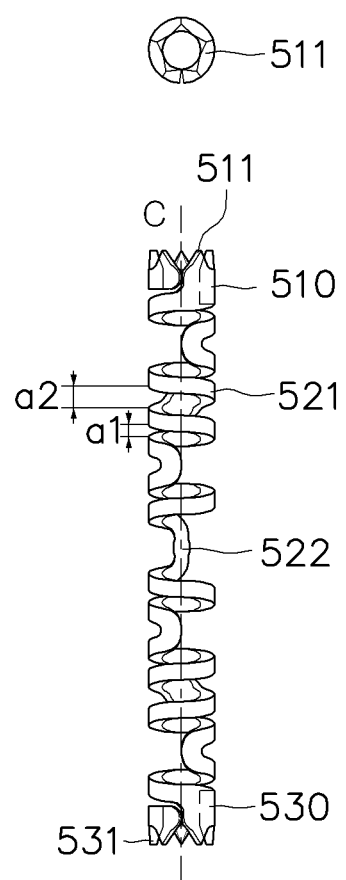
Figure 11:
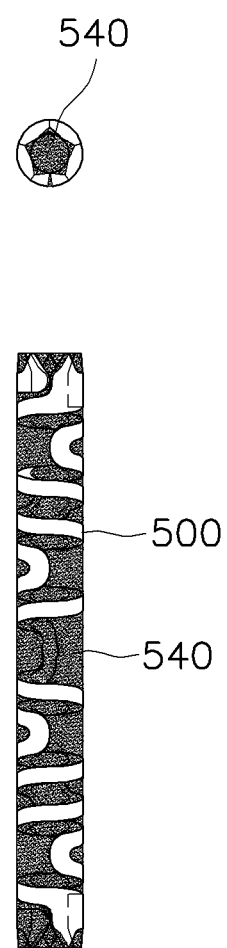

FIGS. 10A, 10B, and 11 are views showing a contact according to a fifth embodiment of the present invention; FIG. 10A is a left side view and a plan view of a plate-shape pattern, from left; FIG. 10B is a plan view and a front view of a contact processed through a rolling-process, from top; and FIG. 11 is a plan view and a front view of a contact of hybrid type that is filled with a filler, from top.

Referring to FIGS. 10A and 10B, a contact 500 of a plate-shaped pattern according to the present embodiment includes an upper head portion 510 having an upper indented portion 511 protruding upwards, an elastic portion 520 of a strip obliquely extending from the upper head portion 510 into a zigzag shape, and a lower head portion 530 having a lower indented portion 531 protruding downwards and formed to extend from a lower end of the elastic portion 520.

Particularly, the elastic portion 520 includes a junction portion 521a of which a width is different in a partial section of the straight strip, and such junction portion 521a allows the elastic portion 520 of a coil shape to have sections of a pitch different to each other (a1≠a2) when rolling the elastic portion 520 into a cylindrical shape, thereby implementing various spring characteristics.

Further, the elastic portion 520 may have a bent portion 522 in a section where a direction of the extending strip is changed, as described in the preceding embodiments.

The lower head portion 530 is coaxial with the upper head portion 510. In other words, the lower head portion 530 has an axis C identical to that of the upper head portion 510, whereby the upper head portion 510, the elastic portion 520, and the lower head portion 530 may be located along the single axis C.

As exemplified in FIG. 11, the contact 500 may be implemented as a contact of hybrid type by filling a cylindrical inner volume with a filler 540 having conductivity and elasticity.

Sixth Embodiment

Figure 12A:
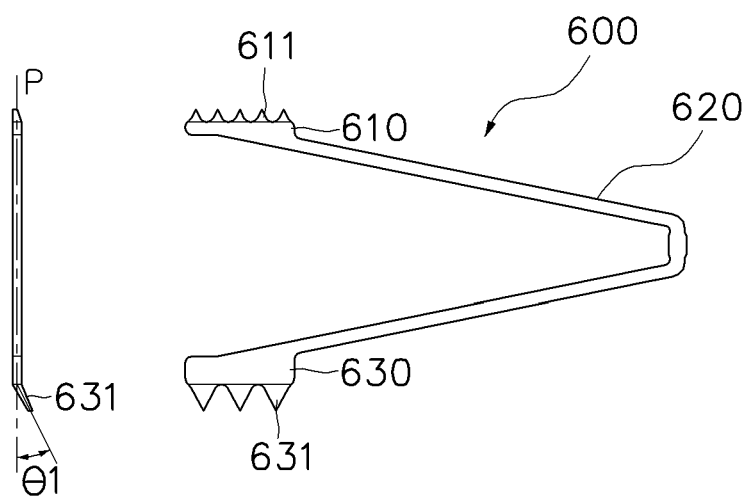
FIGS. 12A, 12B, and 13 are views showing a contact according to a sixth embodiment of the present invention.
Figure 12B:
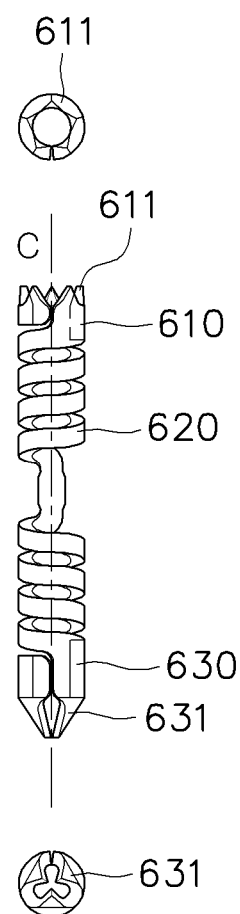
Figure 13:
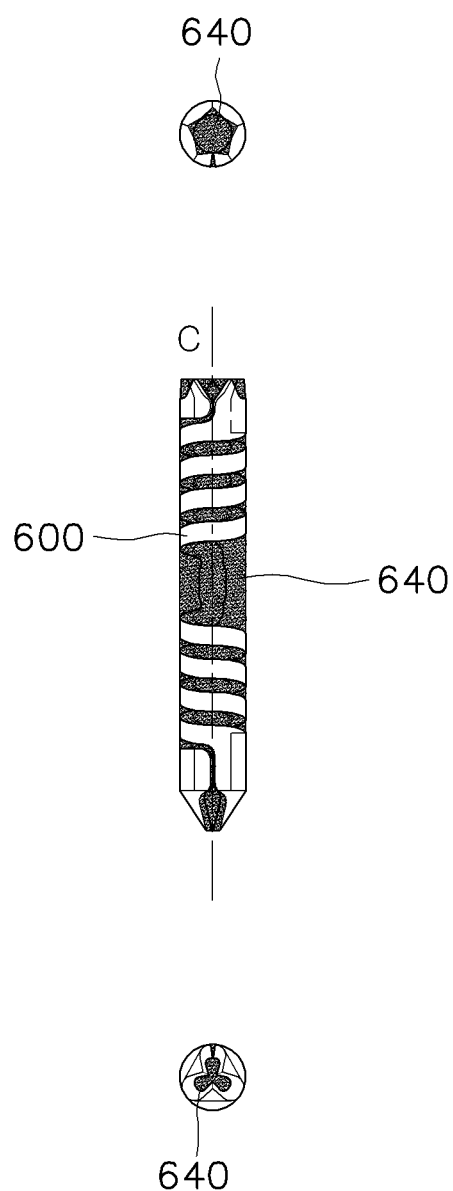

FIGS. 12A, 12B, and 13 are views showing a contact according to a sixth embodiment of the present invention; FIG. 12A is a left side view and a plan view of a plate-shape pattern, from left; FIG. 12B is a plan view, a front view, a bottom view of a contact processed through a rolling-process, from top; and FIG. 13 is a plan view, a front view, and a bottom view of a contact of hybrid type that is filled with a filler, from top.

Referring to FIGS. 12A and 12B, a contact 600 of a plate-shaped pattern according to the present embodiment includes an upper head portion 610 having an upper indented portion 611 protruding upwards, an elastic portion 620 formed of a strip obliquely extending from the upper head portion 610 into a lateral and downward direction, and a lower head portion 630 having a lower indented portion 631 protruding downwards and formed to extend from a lower end of the elastic portion 620.

The upper head portion 610 is constructed by rolling the plate-shaped pattern into a cylindrical shape, and the upper indented portion 611 may have a plurality of teeth protruding upwards along an edge of the upper head portion 610.

The elastic portion 620 may be a strip of a certain width, and spirally bent into a cylindrical shape coaxial with the upper head portion 610. In other words, the elastic portion 620 has an axis C identical to that of the upper head portion 610.

Particularly, according to this embodiment, the lower head portion 630 has a specific inclination angle θ1 with respect to a plane P of the plate-shaped pattern and is processed through bending-process with the cylindrical shape as its center, thereby having a conical shape.

Referring to FIG. 13, the contact 600 allows a cylindrical inner volume thereof to be filled with a filler 640 having conductivity and elasticity.

Seventh Embodiment

Figure 14A:
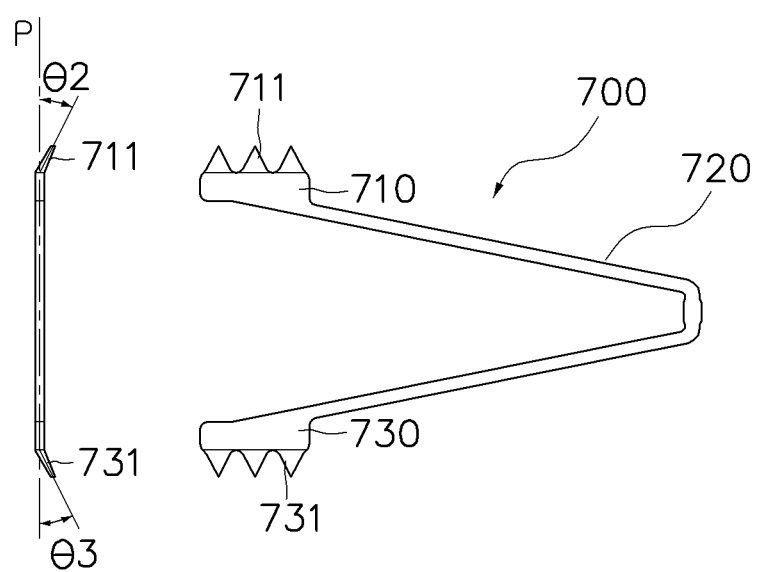
FIGS. 14A, 14B, and 15 are views showing a contact according to a seventh embodiment of the present invention.
Figure 14B:
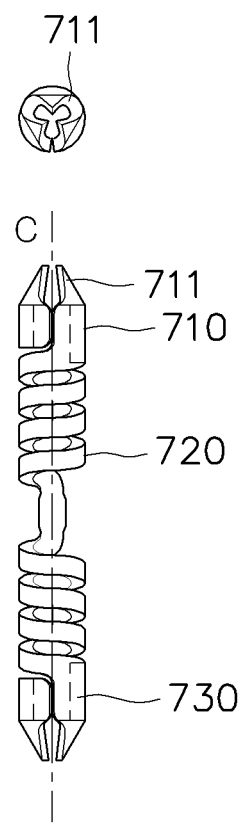
Figure 15:
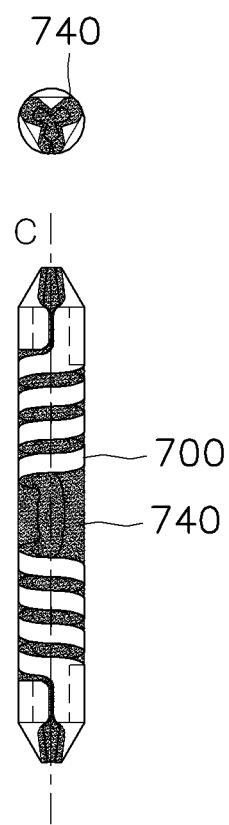

FIGS. 14A, 14B, and 15 are views showing a contact according to a seventh embodiment of the present invention; FIG. 14A is a left side view and a plan view of a plate-shape pattern, from left; FIG. 14B is a plan view and a front view of a contact processed through a rolling-process, from top; and FIG. 15 is a plan view and a front view of a contact of hybrid type that is filled with a filler, from top.

Referring to FIGS. 14A and 14B, a contact 700 of a plate-shaped pattern according to the present embodiment includes an upper head portion 710 having an upper indented portion 711 protruding upwards, an elastic portion 720 formed of a strip obliquely extending from the upper head portion 710 into a lateral and downward direction, and a lower head portion 730 having a lower indented portion 731 protruding downwards and formed to extend from a lower end of the elastic portion 720.

Particularly, according to this embodiment, the upper indented portion 711 includes a plurality of teeth, and has a specific inclination angle θ2 with respect to a plane of the plate-shaped pattern and then bent with the cylindrical shape as its center, whereby the upper indented portion 711 has a conical shape. Further, the lower indented portion 731 includes a plurality of teeth, and has a specific inclination angle θ3 with respect to a plane of the plate-shaped pattern and then bent with the cylindrical shape as its center, whereby the upper indented portion 711 has a conical shape.

Referring to FIG. 15, the contact 700 allows a cylindrical inner volume thereof to be filled with a filler 740 having conductivity and elasticity.

Eighth Embodiment

Figure 16A:
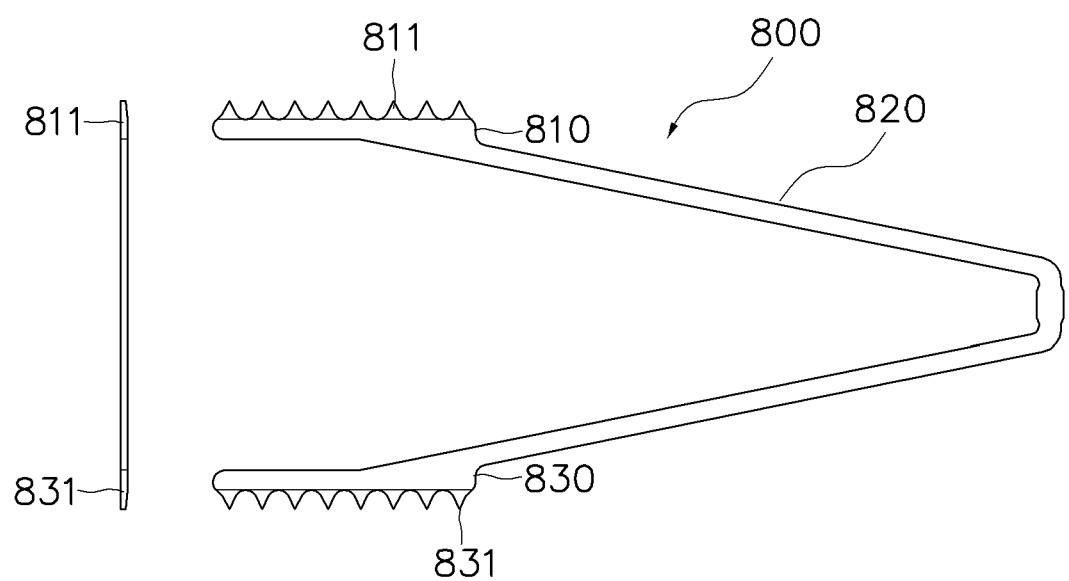
FIGS. 16A, 16B, 17A, and 17B are views showing a contact according to an eighth embodiment of the present invention.
Figure 16B:
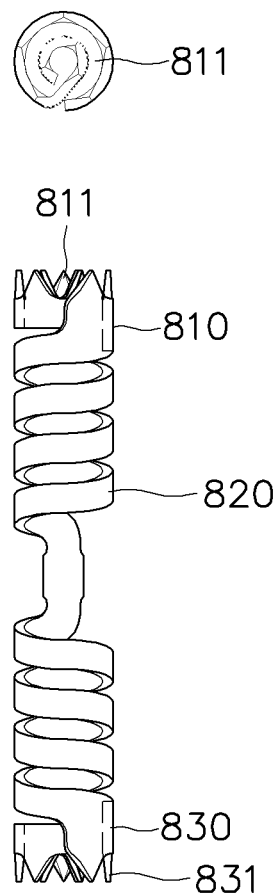
Figure 17A:
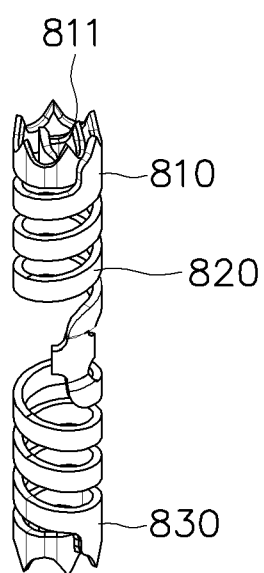
Figure 17B:
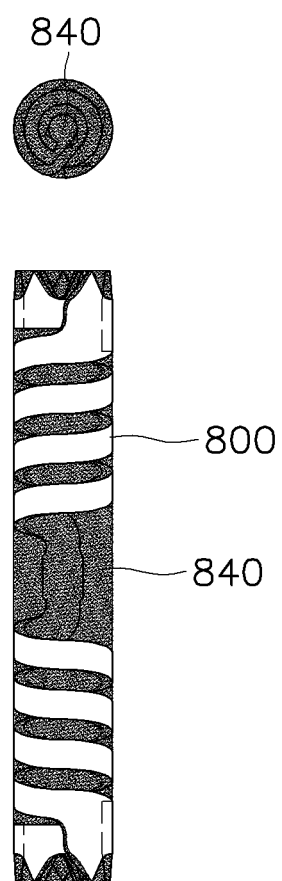

FIGS. 16A. 16B, 17A, and 17B are views showing a contact according to a eighth embodiment of the present invention; FIG. 16A is a left side view and a plan view of a plate-shape pattern, from left; FIG. 16B is a plan view and a front view of a contact processed through a rolling-process, from top; FIG. 17A is a perspective view of a contact of hybrid type filled with a filler; and FIG. 17B is a plan view and a front view thereof, in order from top.

Referring to FIGS. 16A, 16B, 17A, and 17B, a contact 800 of a plate-shaped pattern according to the present embodiment includes an upper head portion 810 having an upper indented portion 811 protruding upwards, an elastic portion 820 formed of a strip obliquely extending from the upper head portion 810 into a lateral and downward direction, and a lower head portion 830 having a lower indented portion 831 protruding downwards and formed to extend from a lower end of the elastic portion 820.

Particularly, according to this embodiment, the upper indented portion 811 and the lower indented portion 831 includes a plurality of teeth, and the upper indented portion 811 and the lower indented portion 831 are spirally wound at least one turn, whereby the upper indented portion 811 and the lower indented portion 831 may have a spirally wound structure in view of a plan view.

Referring to FIG. 17, the contact 800 allows a cylindrical inner volume thereof to be filled with a filler 840 having conductivity and elasticity.

Ninth Embodiment

Figure 18A:
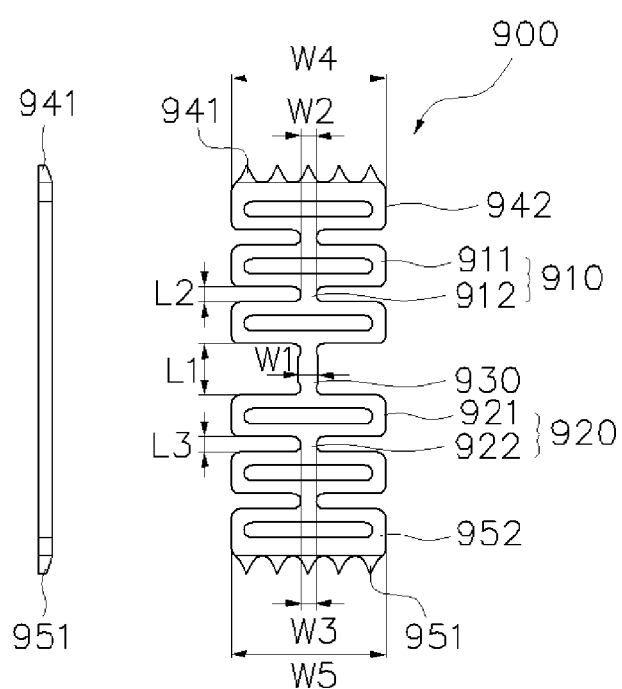
FIGS. 18A, 18B, and 19 are views showing a contact according to a ninth embodiment of the present invention.
Figure 18B:
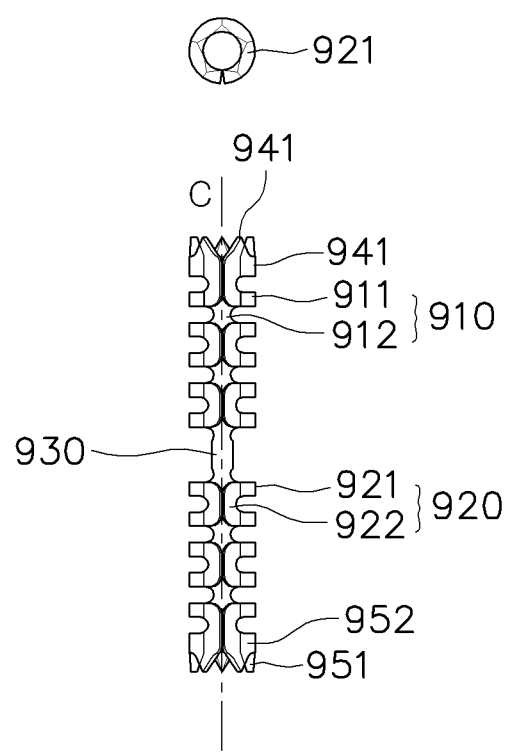
Figure 19:
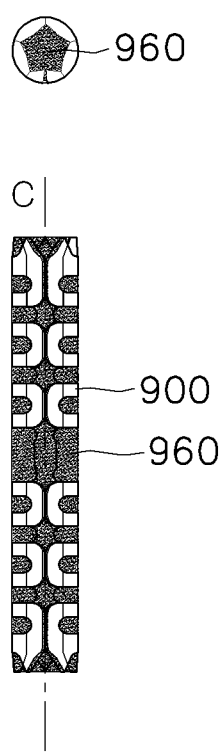

FIGS. 18A, 18B, and 19 are views showing a contact according to a ninth embodiment of the present invention; FIG. 18A is a left side view and a plan view of a plate-shape pattern, from left; FIG. 18B is a plan view and a front view of a contact processed through a rolling-process, from top; and FIG. 19 is a plan view and a front view of a contact of hybrid type that is filled with a filler, from top.

Referring to FIGS. 18A and 18B, the contact 900 of a plate-shaped pattern according to this embodiment includes a first elastic portion 910 formed by connecting a plurality of closed-loop strips 911 of an identical size in series by using a first portion 912 and by bending the closed-loop strips 911 into a cylindrical shape; a second elastic portion 920 formed by connecting a plurality of closed-loop strips 911 of the size identical to the size of the closed-loop strips of the first elastic portion in series by using a second portion 922 and by bending closed-loop strips into a cylindrical shape; a bent portion 930 having a width W1 and a length L1 larger than widths W2, W3 and lengths L2, L3 of the first portion 912 and the second portion 922 and connecting the closed-loop strips in a lowermost end and an uppermost end of the first elastic portion 910 and the second elastic portion 920 in series; an upper head portion 942 having an upper indented portion 941 protruding upwards and extending from the uppermost end of the first elastic portion 910, and being bent into a cylindrical shape; and a lower head portion 952 having a lower indented portion protruding 951 downwards and extending from the lowermost end of the second elastic portion 920, and being bent into a cylindrical shape.

All the closed-loop strips 911, 921 forming the first elastic portion 910 and the second elastic portion 920 according to this embodiment have the same size and roughly rectangular shape, and the adjoining closed-loop strips 911, 921 are connected in series by a single portion 912, 922. Although the first portion 912 and the second portion 922 have the same length (L2=L3) and width (W2=W3) as an example, the length and the width may be different to each other.

Further, although the closed-loop strips are symmetrical with respect to the bent portion 930 because the number of the closed-loop strips forming the first elastic portion 910 is the same to that of the closed-loop strips forming the second elastic portion 920 according to this embodiment, the number of the closed-loop strips forming each of the elastic portions may be different to each other.

Although the upper head portion 942 and the lower head portion 952 have a structure of a unit strip (closed-loop strip) identical to those of the elastic portions 910, 920, various shapes including, but not limited to, rectangular strip rather than the closed-loop strip may be used.

The upper indented portion 941 and the lower indented portion 951 includes a plurality of teeth respectively and the upper indented portion 941 and the lower indented portion 951 may allow the plurality of teeth to have a conical shape. (Refer to a sixth embodiment and FIGS. 12A and 12B)

The first elastic portion 910 and the second elastic portion 920 are bent into a cylindrical shape with the bent portion 930 as a reference point of operation. At this time, the upper head portion 942 and the lower head portion 952 may have a width W4, W5 larger than those of the elastic portions 910, 920 and a structure spirally wound at least one turn. (Refer to an eighth embodiment and FIGS. 16A and 16B)

Referring to FIG. 19, the contact may allow a cylindrical inner volume to be filled with a filler 960 having conductivity and elasticity.

Tenth Embodiment

Figure 20A:
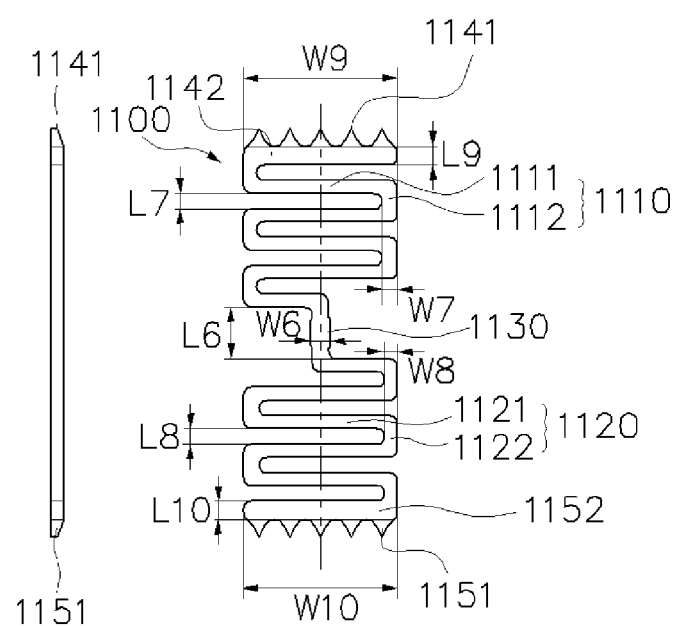
FIGS. 20A, 20B, and 21 are views showing a contact according to a tenth embodiment of the present invention.
Figure 20B:
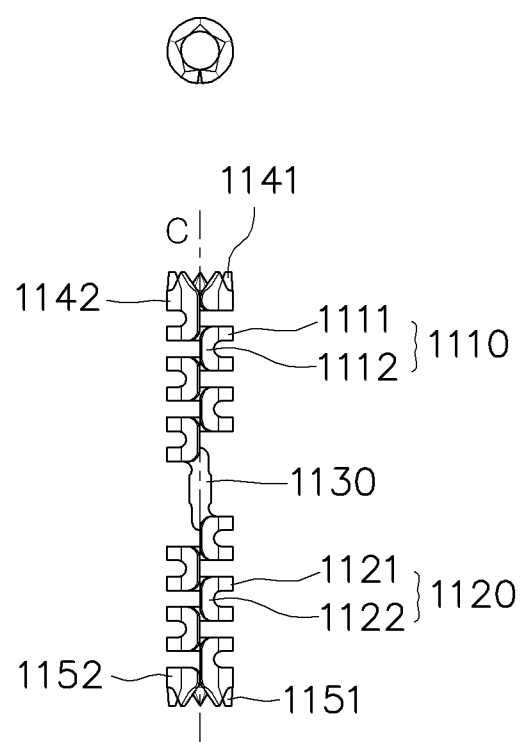
Figure 21:
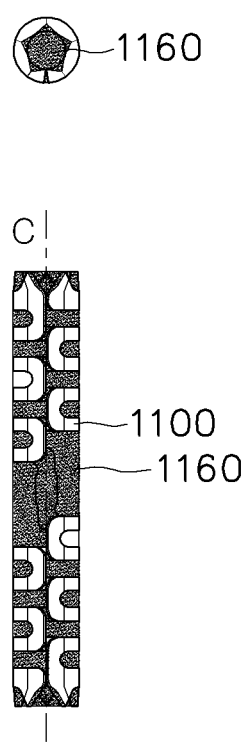

FIGS. 20A, 20B, and 21 are views showing a contact according to a ninth embodiment of the present invention; FIG. 20A is a left side view and a plan view of a plate-shape pattern, from left; FIG. 20B is a plan view and a front view of a contact processed through a rolling-process, from top; and FIG. 21 is a plan view and a front view of a contact of hybrid type that is filled with a filler, from top.

Referring to FIGS. 20A and 20B, the contact 1100 of a plate-shaped pattern according to this embodiment includes a first elastic portion 1110 formed by connecting unit strips 1111, 1112 of a horizontal strip 1111 and a vertical strip 1112 in a zigzag shape, a second elastic portion 1120 formed by connecting unit strips 1121, 1122 having a structure and a size identical to a structure and a size of the first elastic portion in a zigzag shape, a bent portion 1130 having a width W6 and a length L6 larger than widths W7, W8 and lengths L7 L8 of the vertical strips 1112, 1122 in the first elastic portion 1110 and the second elastic portion 1120 and vertically connecting the horizontal strips in a lowermost end and an uppermost end of each of the first elastic portion 1110 and the second elastic portion 1120 to each other at centers of the horizontal strips; an upper head portion 1142 having an upper indented portion 1141 protruding upwards and extending from the uppermost end of the first elastic portion 1110, and being bent into a cylindrical shape; and a lower head portion 1152 having a lower indented portion 1151 protruding downwards and extending from the lowermost end of the second elastic portion 1120, and being bent into a cylindrical shape.

The first elastic portion 1110 includes a unit strip of the horizontal stripe 1111 and the vertical strip 1112 that vertically extends from one end of the horizontal strip 1111 and has a length shorter than that of the horizontal strip 1111, and a plurality of unit strips 1111, 1112 is connected in a zigzag shape.

The second elastic portion 1120 also has a structure and a size identical to those of the first elastic portion 1110, and a plurality of unit strips 1121, 1122 is connected in a zigzag shape.

The bent portion 1130 has a width W6 and a length L6 larger than those of the vertical strip 1112, 1122 in the first elastic portion 1110 and the second elastic portion 1120 and allows the horizontal strip in an lowermost end and an uppermost end of each of the first elastic portion 1110 and the second elastic portion 1120 to be vertically connected to each other at a center region of the horizontal strip, and herein the bent portion 1130 serves as a reference point of operation when processing the elastic portions 1110, 1120 through rolling-process.

Although the upper head portion 1142 and the lower head portion 1152 are identical to horizontal strips 1111, 1121 of the elastic portions 1110, 1120, it is not limited thereto, and a width W9, W10 and a length L9, L10 thereof may be varied.

The upper indented portion 1141 and the lower indented portion 1151 include a plurality of teeth respectively and the upper indented portion 1141 and the lower indented portion 1151 may allow the plurality of teeth to have a conical shape. (Refer to a sixth embodiment and FIGS. 12A and 12B)

The first elastic portion 1110 and the second elastic portion 1120 are bent into a cylindrical shape with the bent portion 1130 as a reference point of operation, and herein the upper head portion 1142 and the lower head portion 1152 may have a width larger than those of the elastic portions 1110, 1120 and a structure spirally wound at least one turn. (Refer to an eighth embodiment and FIGS. 16A and 16B)

Referring to FIGS. 20A and 20B, the contact 1100 may allow a cylindrical inner volume to be filled with a filler 1160 having conductivity and elasticity.

Hereinafter, it will be described on a test socket embodying the contact.

First Embodiment of Test Socket

Figure 22A:
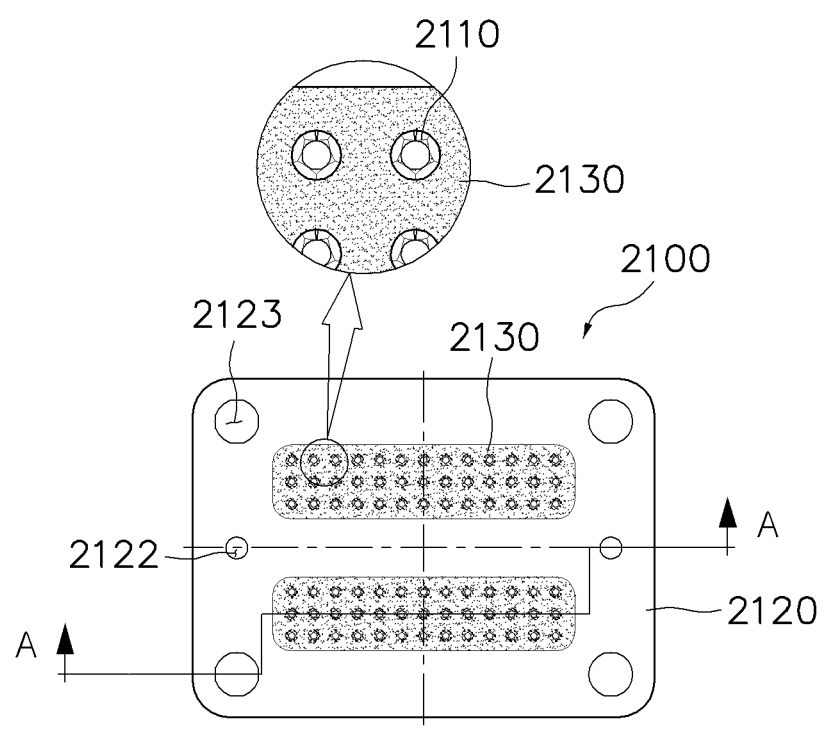
FIGS. 22A and 22B are views showing a test socket according to a first embodiment of the present invention.
Figure 22B:
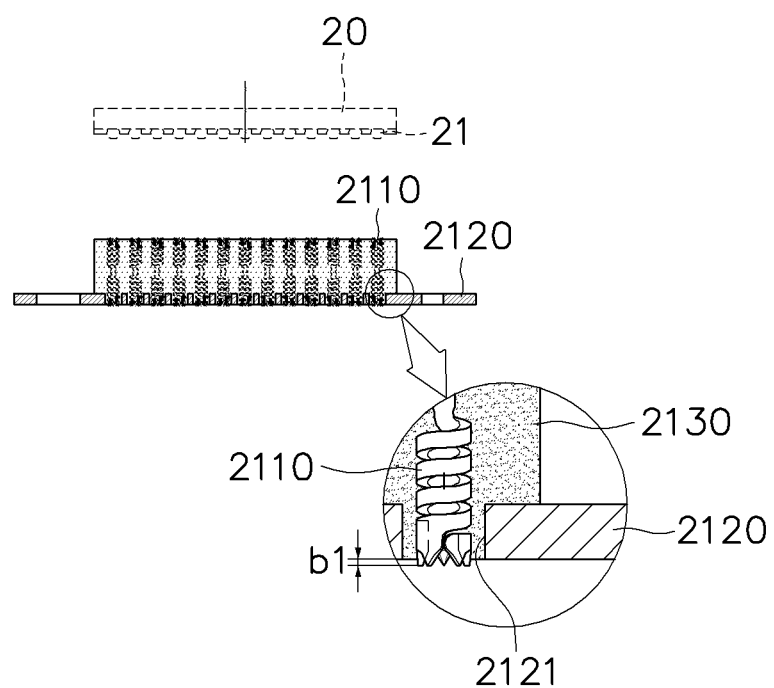

FIGS. 22A and 22B are views showing a test socket according to a first embodiment of the present invention, wherein FIG. 22A is a plan view and FIG. 22B is a sectional view.

Referring to FIGS. 22A and 22B, the test socket 2100 of this embodiment includes a mounting portion 2120 having a plurality of through-holes 2121 corresponding to leads 21 of a device 20 for allowing the contact 2110 to be received and positioned therein, and an elastic insulating body portion 2130 integrally holding the contact 2110 and the mounting portion 2120.

The mounting portion 2120 is an insulating plate, and has the plurality of through-holes 2121 corresponding to the lead of the device 20 for allowing a partial bottom of the contact 2110 to be inserted therein and the insulating body portion 2130 on a top thereof.

A reference number 2122 denotes a guide hole for guiding the test socket into an assembling position, and a reference number 2123 denotes a screw hole for mounting the test socket.

In this embodiment, as the contact 2110, is used a contact integrally formed by rolling it into the cylindrical shape described above.

The insulating body portion 2130 is an elastic insulation member integrally holding the contact 2110 and the mounting portion 2120, with the device 20 placed on a top surface thereof.

The insulating body portion 2130 may be provided using insulating silicon liquid. For example, the contact 2110 is assembled into the through-hole 2121 of the mounting portion 2120, and then using a mold for molding the insulating body portion 2130, it is possible to manufacture the insulating body portion 2130 integrally holding the mounting portion 2120 and the contact 2110 by putting the silicon liquid into the mold, solidifying it, and then removing it from the mold.

Preferably, the lower indented portion of the contact 2110 protrudes outside the through-hole by a specific length b1, thereby realizing efficient contact with the pad of the test device. Meanwhile, the upper indented portion of the contact 2110 protrudes outside a top surface of the insulating body

Second Embodiment of Test Socket

Figure 23A:
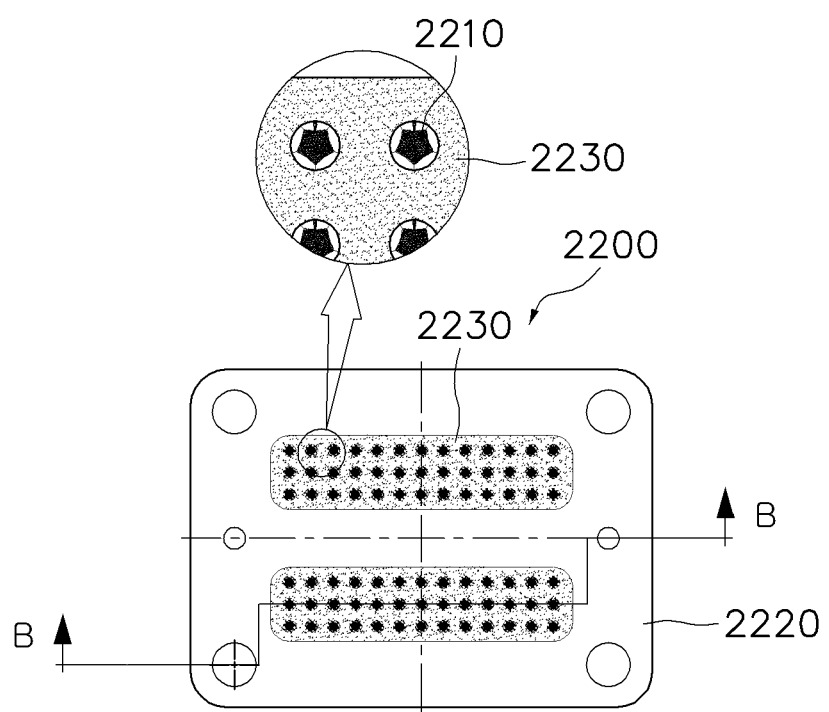
FIGS. 23A and 23B are views showing a test socket according to a second embodiment of the present invention.
Figure 23B:
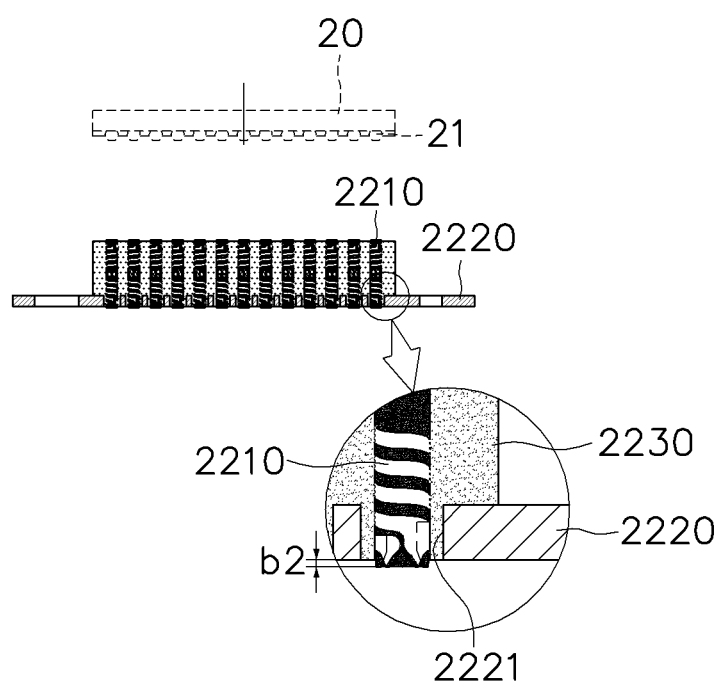

FIGS. 23A and 23B are views showing a test socket according to a second embodiment of the present invention, wherein FIG. 23A is a plan view and FIG. 23B is a sectional view.

Referring to FIGS. 23A and 23B, a test socket 2200 according to this embodiment includes a mounting portion 2220 having a plurality of through-holes corresponding to a lead 21 of a device 20 for allowing a hybrid contact 2210 to be received and positioned therein, and an elastic insulation body portion 2230 integrally holding the hybrid contact 2210 and the mounting portion 2220.

The mounting portion 2220 is an insulating plate, and has the plurality of through-holes 2221 to correspond to the lead 21 of the device 20 for allowing a partial bottom of the hybrid contact 2210 to be inserted therein and the insulating body portion 2230 on a top thereof.

Specifically, in this embodiment, the hybrid contact 2210 is characterized in that a filler having conductivity and elasticity is filled within the contact integrally formed by rolling the contact into the cylindrical shape as described above.

The insulating body portion 2230 is an elastic insulation member integrally holding the hybrid contact 2210 and the mounting portion 2220, with the device 20 placed on a top surface thereof.

As described earlier, the insulating body portion 2230 integrally holds the mounting portion 2120 and the hybrid contact 2210 by solidifying an insulating silicon liquid.

Preferably, the lower indented portion of the contact 2210 protrudes outwards from the through-hole by a specific length b1, thereby realizing efficient contact with the pad of the test device. Meanwhile, the upper indented portion of the contact 2210 protrudes outside a top surface of the insulating body portion 2230 that faces the device 20 by a specific length, thereby realizing efficient contact with the lead 21 of the device 20.

Although the present invention has been described with reference to the exemplary embodiments and drawings, it is to be understood that the present invention is not limited thereto and that various changes and modifications may be made without departing from the spirit and scope of the present invention by those skilled in the art. Various modifications and variations are possible within the scope of the appended claims.

What is claimed is:

1. A contact, integrally formed by blanking a metal plate member and rolling the metal plate member into a cylindrical shape, the contact comprising:
    a first elastic portion formed by connecting unit strips of a horizontal strip and a vertical strip that vertically extends from one end of the horizontal strip and has a length shorter than a length of the horizontal strip in a zigzag shape, and by bending the unit strips into a cylindrical shape;
    a second elastic portion formed by connecting unit strips having a structure and a size identical to a structure and a size of the first elastic portion in a zigzag shape, and by bending the unit strips into a cylindrical shape;
    a bent portion having a width and a length larger than widths and lengths of the vertical strips in the first elastic portion and the second elastic portion, and vertically connecting the horizontal strips at a lowermost end and an uppermost end of each of the first elastic portion and the second elastic portion to each other at centers of the horizontal strips;
    an upper head portion having an upper indented portion protruding upwards and extending from the uppermost end of the first elastic portion, and being bent into a cylindrical shape; and
    a lower head portion having a lower indented portion protruding downwards and extending from the lowermost end of the second elastic portion, and being bent into a cylindrical shape.

2. The contact of claim 1, wherein the upper indented portion comprises a plurality of teeth protruding upwards.

3. The contact of claim 2, wherein the plurality of teeth of the upper indented portion forms a conical shape.

4. The contact of claim 1, wherein the upper indented portion has a cylindrical shape spirally wound at least one turn.

5. The contact of claim 1, wherein the lower indented portion comprises a plurality of teeth protruding downwards.

6. The contact of claim 5, wherein the plurality of teeth of the lower indented portion forms a conical shape.

7. The contact of claim 1, wherein the lower indented portion has a cylindrical shape spirally wound at least one turn.

8. The contact of claim 1, further comprising a filler having conductivity and elasticity that fills at least a coil section between the upper head portion and the lower head portion in a cylindrical shape.

9. A test socket comprising the contact of claim 8, the test socket comprising:
    a mounting portion having a plurality of through-holes corresponding to leads of a device for allowing the contact to be received and positioned therein; and
    an elastic insulating body portion integrally holding the contact and the mounting portion.

10. The test socket of claim 9, wherein a lower indented portion of the contact protrudes outside the through-hole and an upper indented portion thereof protrudes outside an upper surface of the insulating body that faces the device.

* * * * *